United States Patent
Webster

(10) Patent No.: US 12,332,216 B2
(45) Date of Patent: *Jun. 17, 2025

(54) SENSOR WITH DROPLET RETAINING STRUCTURE

(71) Applicant: Qorvo US, Inc., Greensboro, NC (US)

(72) Inventor: James Russell Webster, Minnetonka, MN (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/516,348

(22) Filed: Nov. 21, 2023

(65) Prior Publication Data

US 2024/0094167 A1 Mar. 21, 2024

Related U.S. Application Data

(62) Division of application No. 17/407,577, filed on Aug. 20, 2021, now Pat. No. 11,959,885, which is a
(Continued)

(51) Int. Cl.
*G01N 29/22* (2006.01)
*G01N 29/02* (2006.01)
(Continued)

(52) U.S. Cl.
CPC ......... *G01N 29/222* (2013.01); *G01N 29/022* (2013.01); *G01N 29/2437* (2013.01);
(Continued)

(58) Field of Classification Search
CPC .. G01N 29/022; G01N 29/222; G01N 29/223; G01N 29/2437; G01N 33/53;
(Continued)

(56) References Cited

U.S. PATENT DOCUMENTS

| 4,640,756 A | 2/1987 | Wang et al. |
| 9,922,809 B2 | 3/2018 | McCarron et al. |

(Continued)

FOREIGN PATENT DOCUMENTS

| CN | 1618727 A | 5/2005 |
| CN | 105408739 A | 3/2016 |

(Continued)

OTHER PUBLICATIONS

International Search Report and Written Opinion dated Oct. 9, 2019 from PCT Application No. PCT/US2019/040789, 7 pages.
(Continued)

*Primary Examiner* — Benjamin R Schmitt
(74) *Attorney, Agent, or Firm* — Haynes and Boone, LLP

(57) ABSTRACT

This disclosure describes methods and devices that assist in forming biosensors. Specifically, features that align solutions containing molecules to be immobilized on biosensors. A retaining structure may be disposed at least partially around a target surface of a substrate. A resonating structure may be disposed on the target surface. A droplet of functionalized material may be disposed on the resonating structure and the target surface, which may be auto-aligned and retained by the retaining structure on the target surface to consistently cover the resonating structure.

20 Claims, 8 Drawing Sheets

Related U.S. Application Data division of application No. 16/119,360, filed on Aug. 31, 2018, now Pat. No. 11,099,157.

(60) Provisional application No. 62/694,624, filed on Jul. 6, 2018.

(51) Int. Cl.
  *G01N 29/24* (2006.01)
  *H03H 9/17* (2006.01)

(52) U.S. Cl.
  CPC ..... *H03H 9/175* (2013.01); *G01N 2291/0255* (2013.01); *G01N 2291/0426* (2013.01)

(58) Field of Classification Search
  CPC .. G01N 33/531; G01N 33/537; G01N 33/543; G01N 33/54393; G01N 33/558; G01N 2291/0426; G01N 2291/0255; H03H 9/175
  See application file for complete search history.

(56) References Cited

U.S. PATENT DOCUMENTS

| | | |
|---|---|---|
| 2003/0194709 A1 | 10/2003 | Yang |
| 2004/0150296 A1 | 8/2004 | Park et al. |
| 2005/0148065 A1 | 7/2005 | Zhang et al. |
| 2007/0134721 A1* | 6/2007 | Laitenberger ...... A61B 5/14546 435/7.1 |
| 2008/0134767 A1 | 6/2008 | Wakamatsu et al. |
| 2009/0071833 A1 | 3/2009 | Gorfinkel et al. |
| 2009/0277271 A1 | 11/2009 | Seppa et al. |
| 2010/0135854 A1 | 6/2010 | Yang et al. |
| 2012/0164753 A1 | 6/2012 | Johnston et al. |
| 2012/0227474 A1 | 9/2012 | Nirschl et al. |
| 2014/0037504 A1 | 2/2014 | Masters et al. |
| 2015/0086424 A1 | 3/2015 | Putnam et al. |
| 2016/0091506 A1 | 3/2016 | Webster |
| 2017/0122911 A1 | 5/2017 | McCarron et al. |
| 2017/0294892 A1 | 10/2017 | Diep |
| 2018/0126381 A1 | 5/2018 | Huff et al. |

FOREIGN PATENT DOCUMENTS

| | | |
|---|---|---|
| CN | 105431943 A | 3/2016 |
| DE | 102012218052 | 4/2014 |
| EP | 1589340 A1 | 10/2005 |
| JP | 2004-264023 A | 9/2004 |
| JP | 2005187316 A | 7/2005 |
| JP | 2006023301 A2 | 1/2006 |
| JP | 2007-520715 A | 7/2007 |
| JP | 2007327931 A | 12/2007 |
| JP | 2010-133927 A | 6/2010 |
| JP | 2015127691 A | 7/2015 |
| JP | 2019-060762 A | 4/2019 |
| WO | 2005/075995 A1 | 8/2005 |
| WO | 2018/031055 A | 2/2018 |
| WO | 2018106814 A1 | 6/2018 |

OTHER PUBLICATIONS

International Preliminary Report on Patentability dated Jan. 21, 2021 from PCT Application No. PCT/US2019/040789, 6 pages.
Extended European Search Report mailed Feb. 1, 2022 in European Application No. EP 19 83 0508, 9 pages.
Office Action from Japanese application No. 2021-500179 mailed Jun. 6, 2023, received Jul. 26, 2023, original and translation, 10 pages.
Office Action mailed Nov. 7, 2023 in related application No. JP 2021-500179, 10 pages.
First Office Action mailed Jun. 14, 2024 in related Chinese application No. 2019800450733, 13 pages.
Korkmaz, "Fast and Scalable Interfacial Convective Assembly of Nanoparticles For Interconnects Applications," Boston, Massachussets, Apr. 2017, 24 pages.
Liu Ruxiu, "D-dimer Detection Based on QCm Immunosensor," Zhejiang University, Sep. 15, 2014, CNKI, 4 pages.

* cited by examiner

SENSOR WITH DROPLET RETAINING STRUCTURE

CROSS-REFERENCE TO RELATED APPLICATIONS

The present application is a divisional of U.S. patent application Ser. No. 17/407,577, filed Aug. 20, 2021, which is a divisional of U.S. patent application Ser. No. 16/119,360, filed Aug. 31, 2018, which claims the benefit of U.S. Provisional Application No. 62/694,624, filed Jul. 6, 2018, the disclosures of which are incorporated herein by reference in their entirety.

FIELD

This disclosure relates to devices and methods for forming biosensors and more specifically for immobilizing molecules when forming biosensors.

BACKGROUND

There are numerous instruments and measurement techniques for diagnostic testing of materials related to medical, veterinary medical, environmental, biohazard, bioterrorism, agricultural commodity, and food safety. Molecule immobilization is used to form some diagnostic test apparatus.

Immobilization of molecules, such as antibodies or antigens on sensor surfaces, typically involves the use of low-volume, non-contact liquid printing techniques such as piezoelectric dispensing or microvalve dispensing. In these systems the location of the printing can change during the printing process due to a variety of factors such as, air currents and changes in the surface of the printing tip. These effects can be amplified as the tip is raised further away from the surface. To compensate for these effects, volumes that are larger than necessary have been printed to accommodate variations in printing location.

SUMMARY

This disclosure describes methods and devices that provide alignment when printing molecules on sensor surfaces, thereby eliminating or at least minimizing the need to print larger volumes than necessary. Printing larger volumes than necessary can have adverse effects on device performance, particularly when forming acoustic wave sensors, such as bulk acoustic wave sensors (BAWs), which can be used to detect the presence of an analyte in a sample. Mechanical features are provided around a sensor, such as an acoustic wave sensor, that may ensure alignment when printing the molecules on the sensors. As described in this disclosure, mechanical features can include a retaining structure defined in or on a substrate at least partially around a target surface. A resonating structure, or resonator structure, may also be disposed on the target surface. A droplet of functionalized material, which may be used to more specifically bind to an analyte for detection, may be disposed on the target surface and the resonating structure. Advantageously, use of the retaining structure may prevent the droplet from moving and/or being misaligned and may allow the use of a smaller droplet than would otherwise be used to ensure consistent coverage of the resonating structure by the functionalized material. The sensor with retaining structure may facilitate more consistent results in manufacturing and using acoustic wave sensors compared to some existing techniques.

In one aspect, the present disclosure provides a sensor. The sensor includes a substrate defining a target surface and a retaining structure extending at least partially around the target surface. The target surface defines an axis orthogonal to the target surface. The retaining structure has a height extending in a direction of the axis and a width extending in a direction that is orthogonal to the axis. The resonating structure is disposed on the target surface of the substrate including a piezoelectric layer. An insulating layer is disposed on the resonating structure and configured to couple to a functionalized material.

In another aspect, the present disclosure provides a method. The method includes forming a retaining structure at least partially around a target surface of a substrate. The method also includes disposing a resonating structure on the target surface of the substrate. The method further includes disposing a droplet of functionalized material on the resonating structure and the target surface.

The details of one or more aspects of the disclosure are set forth in the accompanying drawings and the description below. Other features, objects, and advantages of the techniques described in this disclosure will be apparent from the description and drawings, and from the claims.

Figure 1:
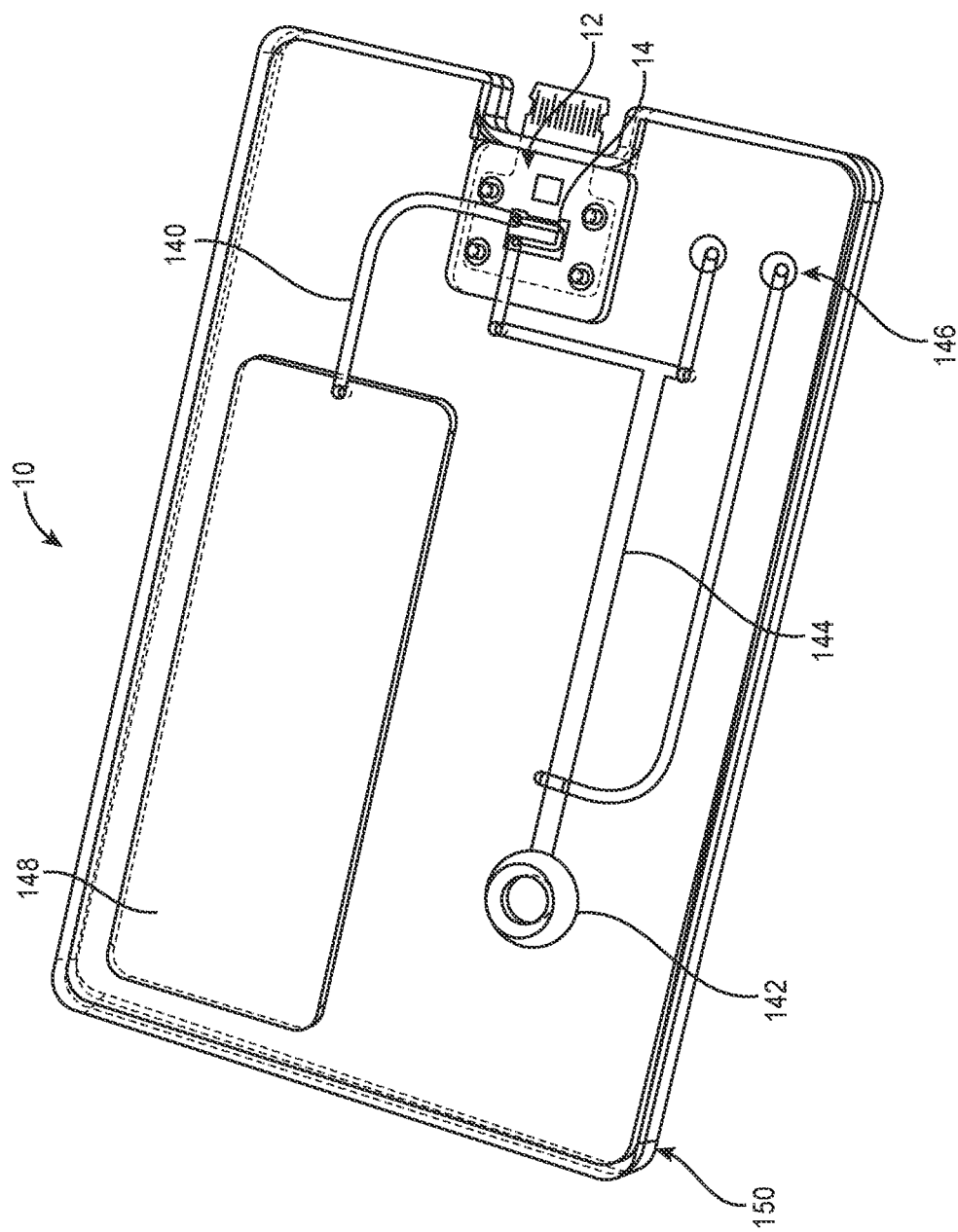
FIG. 1 is a perspective view of a sensing system according to one embodiment of the present disclosure.

The schematic drawings are not necessarily to scale. Like numbers used in the figures refer to like components, steps and the like. However, it will be understood that the use of a number to refer to a component in any figure is not intended to limit the component in another figure labeled with the same number. In addition, the use of different numbers to refer to components is not intended to indicate that the different numbered components cannot be the same or similar.

DETAILED DESCRIPTION

This disclosure relates to sensors, such as acoustic wave sensors, that may be used to detect the presence of an analyte in a sample. Although reference is made herein to acoustic wave sensors, such as bulk acoustic wave (BAW) sensors for detecting biomolecules, various aspects of the present disclosure may be used with any sensor having a substrate that receives a droplet. Various other applications will become apparent to one of skill in the art having the benefit of the present disclosure.

When printing droplets to form a sensor, such as an antibody solution droplet printed onto a substrate with a resonator structure, the dispensed droplets may "wander" due to a variety of effects, such as air currents, surface changes on the dispensing tip, and contact angle non-uniformities on the surface of the substrate. Existing techniques have compensated for this "wandering" by overprinting the droplet, which can make high-volume manufacturing difficult. Such overprinting can affect device performance by increasing the variability of the measured binding reactions. For example, larger droplets may more easily shift around than smaller droplets. Further, some issues may arise during use of the sensor formed with a printed antibody solution droplet external to the resonating structure. For example, the sample to be tested may be depleted by binding to antibodies external to the resonating structure instead of binding to the antibodies on the resonating structure. Further, the analyte bound external to the resonating structure may fall on the resonating structure. Either or both of these issues can affect the consistency of measuring binding reactions using the resonating structure and a larger droplet.

It may be beneficial to provide a target surface and retaining structure for a droplet to form a sensor that may "auto-align" the droplet to a target surface or area or prevent the droplet from "wandering" or moving from the target surface or area. It may be beneficial to provide a target surface and retaining structure that allows for the use of a smaller droplet than would otherwise be used to ensure consistent coverage of the resonating structure by the functionalized material. It may further be beneficial to provide a technique that facilitates high-volume manufacturing for antibody solution droplets, or droplets of functionalized material that efficiently uses the antibody solution droplets and improves manufacturing yield.

In devices disclosed herein, structures are provided to align the dispensed solution droplet and limit the "wandering" effect of the droplet. In some embodiments, various structures on the BAW surface can be utilized to auto-align the dispensed solution droplet even when the dispensing tip isn't accurately aligned to the resonator center.

A retaining structure may be defined in or on a substrate at least partially around a target surface. A resonator may be disposed on the target surface. A droplet of functionalized material may be disposed on the target surface, which may be used to bind to an analyte for detection to the resonating structure, or resonator structure. In some embodiments, the sensor includes a substrate defining a target surface and a retaining structure extending at least partially around the target surface. A resonating structure may be disposed on the target surface of the substrate including a piezoelectric layer. An insulating layer may be disposed on the resonating structure and be configured to couple to a functionalized material. In some embodiments, a droplet of functionalized material may be disposed on the resonating structure and the target surface. The retaining structure and the resonating structure may be formed concurrently or sequentially in any order.

Some sensors described herein are analytical devices that include a biomolecule (e.g., biological molecule) and a transducer may be used to convert changes in mechanical movement due to binding events between a target and the biomolecule into an electrical signal. Certain devices involve a selective interaction between a biomolecule and a target. For example, the biomolecule may be a specific binding material (e.g., an antibody, a receptor, a ligand, etc.) and the target may be a molecule, a protein, DNA, a virus, a bacterium, etc. A binding event or a plurality of binding events between the specific binding material and the target may be converted into a measurable quantity by a transducer. In other embodiments, sensors may utilize a non-specific binding material capable of binding multiple types or classes of molecules or other moieties that may be present in a sample, such as may be useful in chemical sensing applications.

In some embodiments, the sensors are acoustic wave devices. An acoustic wave device employs an acoustic wave that propagates through or on the surface of a piezoelectric material, whereby changes to the characteristics of the propagation path affect the velocity and/or amplitude of the wave. Presence of a biomolecule on or over an active region of an acoustic wave device permits an analyte to be bound to the biomolecule, thereby altering the mass being vibrated by the acoustic wave and altering the wave propagation characteristics (e.g., velocity, thereby altering resonance frequency). Changes in velocity can be monitored by measuring the frequency, magnitude, or phase characteristics of the acoustic wave device and can be correlated to a physical quantity being measured.

The acoustic wave devices describe herein may include a piezoelectric crystal resonator as part of a resonating structure. With such devices, an acoustic wave may embody a bulk acoustic wave (BAW) propagating through the interior of a substrate.

BAW sensors typically involve transduction of an acoustic wave using electrodes arranged on opposing top and bottom surfaces of a piezoelectric material. In a BAW sensor, three wave modes may propagate, namely, one longitudinal mode (embodying longitudinal waves, also called compressional/extensional waves), and two shear modes (embodying shear waves, also called transverse waves), with longitudinal and shear modes respectively identifying vibrations where particle motion is parallel to or perpendicular to the direction of wave propagation. The longitudinal mode is characterized by compression and elongation in the direction of the propagation, whereas the shear modes consist of motion perpendicular to the direction of propagation with no local change of volume. Longitudinal and shear modes propagate at different velocities. In practice, these modes are not necessarily pure modes as the particle vibration, or polarization, is neither purely parallel nor purely perpendicular to the propagation direction. The propagation characteristics of the respective modes depend on the material properties and propagation direction respective to the crystal axis orientations. The ability to create shear displacements is beneficial for operation of acoustic wave devices with fluids (e.g., liquids) because shear waves do not impart significant energy into fluids. BAW sensors include bulk acoustic resonators deposited on one or more reflective layers, such as Bragg mirror, and film bulk acoustic resonators having an air-gap.

The sensor described herein may employ any suitable piezoelectric thin film. Certain piezoelectric thin films are capable of exciting both longitudinal and shear mode resonance, such as hexagonal crystal structure piezoelectric materials including (but not limited to) aluminum nitride (AlN) and zinc oxide (ZnO). To excite a wave including a shear mode using a piezoelectric material layer arranged between electrodes, a polarization axis in a piezoelectric thin film is generally non-perpendicular to (e.g., tilted relative to) the film plane. In sensing applications involving liquid media, the shear component of the resonator may be used. In such applications, piezoelectric material may be grown with a c-axis orientation distribution that is non-perpendicular relative to a face of an underlying substrate to enable a BAW resonating structure to exhibit a dominant shear response upon application of an alternating current signal across electrodes thereof. Conversely, a piezoelectric material grown with a c-axis orientation that is perpendicular relative to a face of an underlying substrate will exhibit a dominant longitudinal response upon application of an alternating current signal across electrodes thereof.

Reference will now be made to the drawings, which depict one or more aspects described in this disclosure. However, it will be understood that other aspects not depicted in the drawings fall within the scope of this disclosure. Like numbers used in the figures refer to like components, steps and the like. However, it will be understood that the use of a reference character to refer to an element in any figure is not intended to limit the element in another figure labeled with the same reference character. In addition, the use of different reference characters to refer to elements in different figures is not intended to indicate that the differently referenced elements cannot be the same or similar.

FIG. 1 shows a sensing system 10 (for example, a cartridge) having a die 12 (for example, sensor die) housing a microfluidic channel 14. The sensing system 10 may include or be operatively coupled to a detection platform to receive resonator data. The detection platform may be removably coupled to the sensing system 10.

The microfluidic channel 14 may be configured to receive a sample liquid. Die 12 may be coupled to a sensor platform 150 to fluidly couple the channel 14 to a fluid flow path 140 housed in the sensor platform. The fluid flow path 140 may extend from a sample port 142 to a waste chamber 148. A sample fluid may be injected into the sample port 142 in fluid communication with a sample reservoir 144 along the fluid flow path 140. The sample fluid may contain a target material (e.g., analyte). The sample reservoir 144 may have a hydrophilic surface to draw the sample fluid into the reservoir. Sample handling fluid, such as buffer solution or complex matrix, may be injected into handling fluid ports 146 in fluid communication with the sample reservoir 144. The sample handling fluid may be used to push the sample fluid through the sample reservoir 144 toward the channel 14 of the die 12. Sample fluid may flow through the channel 14 to the waste chamber 148. As sample fluid passes through or resides in the channel 14 of the die 12, the presence of target material in the sample fluid may be measured. The die 12 may be operatively coupled to an external detection platform (not shown) to further analyze measurement data. A complex matrix may include biological fluid, such as urine, blood, serum, plasma, or saliva.

Figure 2:
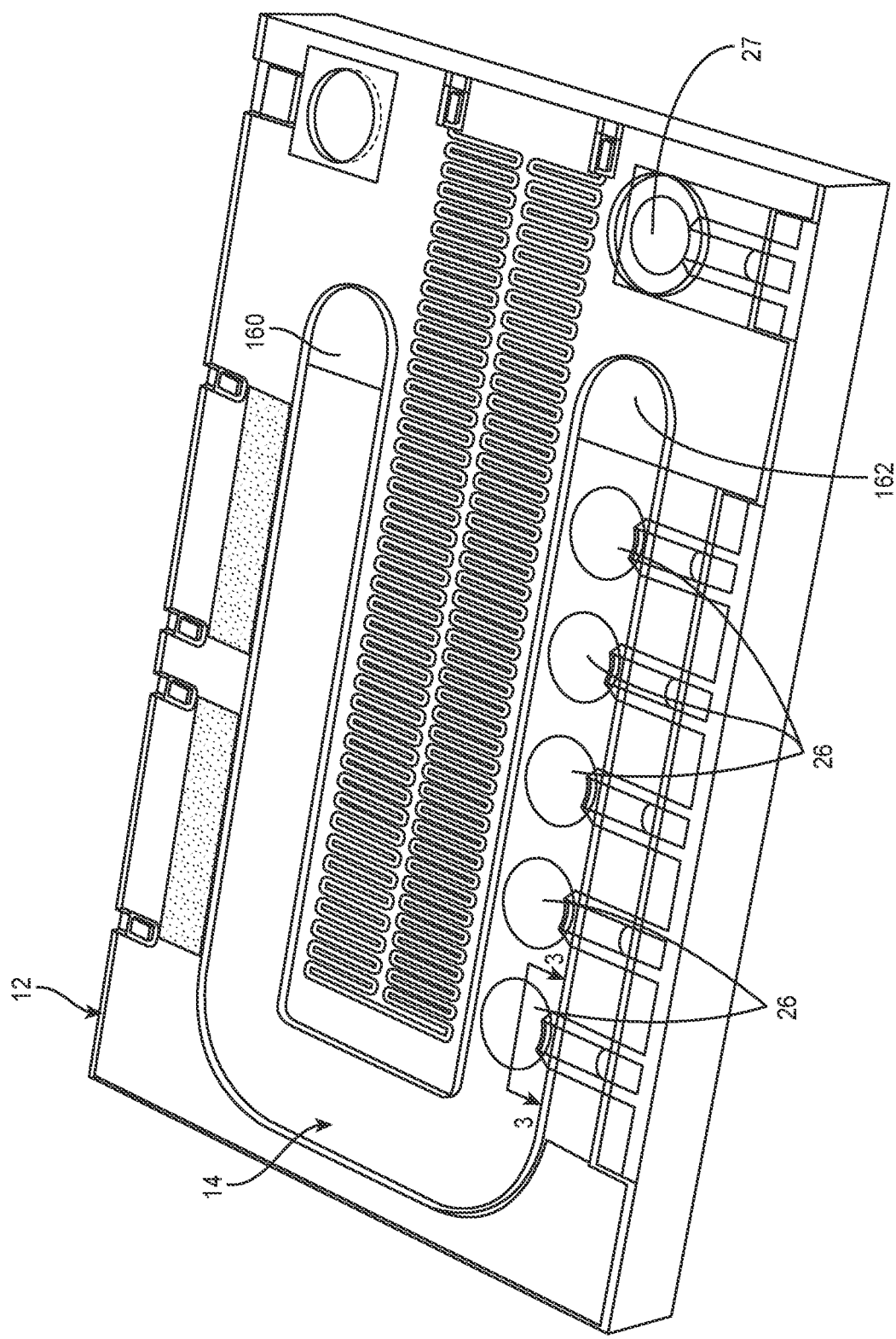
FIG. 2 is a perspective view of a sensor die of the sensing system of FIG. 1.

FIG. 2 shows the die 12 housing the microfluidic channel 14 and a plurality of resonator structure 26 disposed along the channel. The resonator structures 26 may be arranged in series, in parallel, or a combination of both along the channel 14. The resonator structures 26 may be exposed to the channel 14 to allow any fluid in the channel to flow over the resonator structures. One or more of the resonator structures 26 may be described as sensing resonators including specific binding material on a surface to bind target material. One or more of the resonator structures 26 may be described as reference resonators. A reference resonator structure may include non-specific binding material on a surface. The non-specific binding material may be similar to the specific binding material (for example, an antibody) but bind to a non-target material, which may be unlikely to be found in sample fluid. The non-specific binding material may be selected based on the particle size of the non-target material that binds to the non-specific binding material being similar to the particle size of the target material. A reference resonator structure may include non-functionalized binding material, such as silane, that may not bind to any material in the sample fluid.

The die 12 may include a remote reference resonator structure 27. The remote reference resonator structure 27 may be acoustically coupled to a different type of fluid than the sample fluid. For example, the remote reference resonator structure 27 may be acoustically coupled to air.

Walls of the microfluidic channel 14 may be formed of any suitable material, such as laser-cut "stencil" layers of thin polymeric materials and/or laminate materials, optionally including one or more self-adhesive surfaces (for example, adhesive tape). Optionally such walls may be formed prior to deposition of a self-assembled monolayer (SAM), functionalized material, and/or blocking layers. The walls may be made with a SU-8 negative epoxy resist or other photoresist material. In certain embodiments, a cover or cap layer may be integrally formed with one or more walls (for example, via molding or another suitable process) to define a portion of an upper boundary as well as lateral boundaries of at least one fluidic channel, and the integrally formed partial cover-and-wall structure may be applied (for example, adhered or otherwise bonded) to enclose the at least one fluidic channel.

The channel 14 may extend a length from a proximal end portion (for example, upstream port 160) to a distal end portion (for example, downstream port 162). In general, sample fluid may enter the channel 14 in the upstream port 160 and leave the channel in the downstream port 162. However, the fluid flow may be modulated, for example, stalled or even reversed in some cases. When the die 12 is coupled to the sensing platform 150 (FIG. 1), the upstream port 160 may be in fluid communication with the sample port 142 (FIG. 1) and the downstream port 162 may be in fluid communication with the waste chamber 148 (FIG. 1). The channel 14 may extend parallel to a plane or be described as planar. The channel 14 may have a U-shape.

Figure 3B:
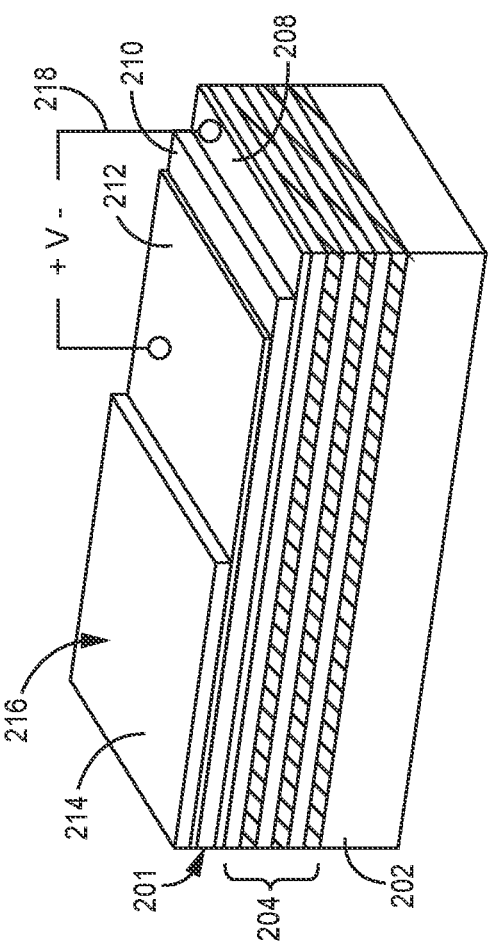
FIG. 3B is a perspective view of the bulk acoustic wave sensor of FIG. 3A.
Figure 3A:
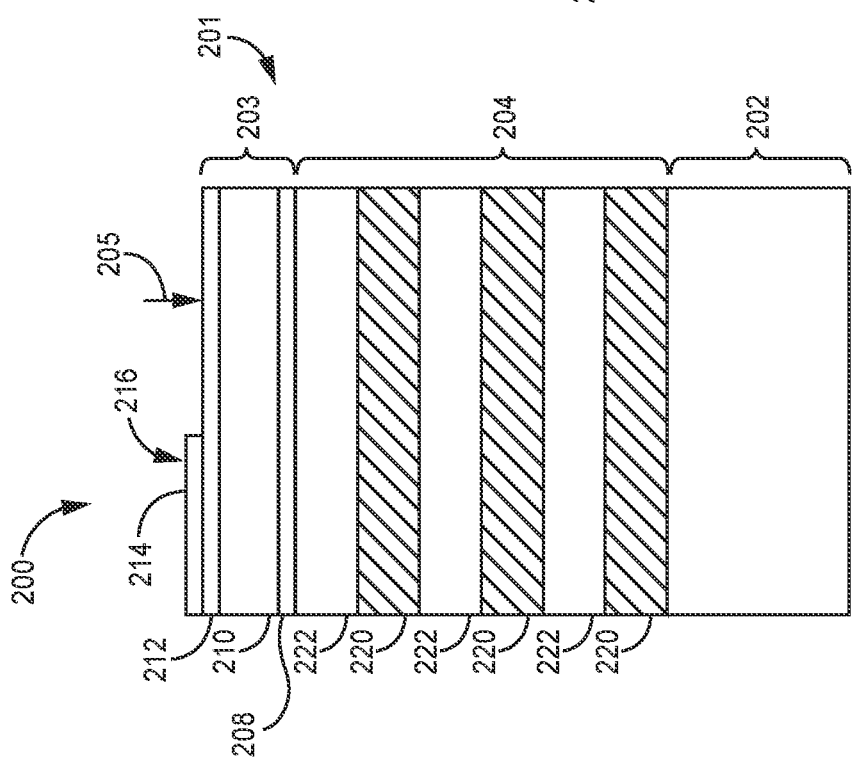
FIG. 3A is a cross-sectional view at line 3-3 (FIG. 2) of a bulk acoustic wave sensor of the die of FIG. 2.

FIGS. 3A and 3B show a portion of a bulk acoustic wave (BAW) sensor 200, which includes a resonating structure 201, or resonator structure, disposed on a substrate 202. FIG. 3A is a view along cross-sectional line 3-3 (FIG. 2). For illustrative purposes, portions of some of the layers are removed in FIG. 3B.

In the illustrated embodiment, the resonating structure 201 of the sensor 200 includes an acoustic mirror layer 204 (for example, an acoustic reflector), a first electrode 208 (for example, a bottom electrode) disposed on the mirror layer 204, a piezoelectric layer 210 disposed on the first electrode 208, a second electrode 212 (for example, a top electrode) disposed on the piezoelectric layer, and an insulating layer 214 disposed on the second electrode. The piezoelectric layer 210 may be formed of a piezoelectric transducer, which may operate in a shear wave mode or a longitudinal wave mode.

In some embodiments, the substrate 202 may not be considered part of the resonating structure 201 because the substrate may not affect the resonance properties of the sensor 200. However, in some other embodiments, the substrate 202 may be considered part of the resonating structure 201.

The substrate 202 may be disposed adjacent to the acoustic mirror layer 204, opposite to the first electrode 208. The substrate 202 may be formed of any suitable material upon which layers can be disposed. In some embodiments, the substrate 202 is formed of a semiconductor material. For example, the substrate 202 may be formed of silicon (Si), silicon nitride ($Si_3N_4$), or another semiconductor wafer material, such as gallium arsenide (GaAs). In some embodiments, the substrate 202 is formed of a non-semiconductor material. For example, the substrate 202 may be formed of alumina or sapphire.

A base resonator 203 includes the first electrode 208, the piezoelectric layer 210, and the second electrode 212. The acoustic mirror layer 204 may be described as adjacent to the base resonator 203.

The resonating structure 201 may define a base resonator thickness 205 equal to about one-half of a predetermined wavelength, or one half-wavelength. The base resonator 203 may be defined by the electrodes 208, 212 and the piezoelectric layer 210. The base resonator thickness 205 may be equal to the distance between the top of the second electrode 212 and the bottom of the first electrode 208, or in other words, the distance between the furthest surfaces of the electrodes 208, 212.

The acoustic mirror layer 204 serves to reflect acoustic waves and therefore reduce or avoid their dissipation in the substrate 202. The acoustic mirror layer 204 may include alternating layers of different material. The acoustic mirror layer 204 may include a first layer 220 and a second layer 222, which alternate to form the acoustic mirror. In some embodiments, the first and second layers 220, 222 are alternating thin layers of materials having different acoustic impedance values, optionally embodied in a quarter-wave Bragg mirror, deposited over the substrate 202. Non-limiting examples of materials used in the layers 220, 222 include: silicon oxicarbide (SiOC), silicon nitride ($Si_3N_4$), silicon dioxide ($SiO_2$), aluminum nitride (AlN), tungsten (W), and molybdenum (Mo). For example, the first layer 220 may be formed of aluminum nitride (AlN) and the second layer may be formed of tungsten (W). In some embodiments, other types of acoustic reflectors may be used. Although a certain number of layers 220, 222 are shown for illustrative purposes, any suitable number of layers may be used in forming the resonator structure 201.

The sensor 200 may have a surface that defines at least a portion of the microfluidic channel 14 (FIG. 1). For example, the surface 216 of the insulating layer 214 may define at least a portion of the channel 14.

The resonating structure 201 of the sensor 200 may be formed using any suitable method. In some embodiments, the resonating structure 201 is formed using a thin-film technique, such as thin-film deposition, that allows layers of nanometer to several micrometer thickness to be formed.

In one thin-film technique, the substrate 202 may be provided. The acoustic mirror layer 204 may be deposited onto the substrate 202. A first electrode 208 may be deposited on the acoustic mirror layer 204. Further, the piezoelectric layer 210 may be grown (for example, via sputtering or other appropriate methods) on the first electrode 208. The second electrode 212 may be deposited on the piezoelectric layer 210. Some methods for forming acoustic wave sensors are disclosed in U.S. Patent Application Publication 2017/0294892, published Oct. 12, 2017, which is incorporated entirely herein by reference.

In certain embodiments, the piezoelectric layer 210 has a hexagonal crystal structure piezoelectric material (for example, AlN or ZnO) that includes a c-axis having an orientation distribution that is predominantly non-parallel (and may also be non-perpendicular to) to normal of a face of the substrate 202. Under appropriate conditions, presence of a c-axis having an orientation distribution that is predominantly non-parallel to normal of a face of a substrate enables a BAW resonating structure to be configured to exhibit a dominant shear response upon application of an alternating current signal across a distal electrode and a proximal electrode thereof (for example, as may be desirable in the context of a BAW resonating structure providing sensing utility). Some methods for forming hexagonal crystal structure piezoelectric materials including a c-axis having an orientation distribution that is predominantly non-parallel to normal of a face of a substrate are disclosed in U.S. patent application Ser. No. 15/293,063, filed on Oct. 13, 2016, which is incorporated entirely herein by reference. Some additional methods for forming piezoelectric materials having an inclined c-axis orientation are disclosed in U.S. Pat. No. 4,640,756, issued on Feb. 3, 1987, which is incorporated entirely herein by reference.

The second electrode 212 of the resonating structure 201 may be overlaid with various layers, such as one or more of: a hermeticity layer, an interface layer, a self-assembled monolayer (SAM), and/or a functionalized material layer (which may include specific binding material or non-specific binding material). In some embodiments, the second electrode 212 is overlaid with the insulating layer 214.

Any suitable method may be used to dispose the insulating layer 214 onto the second electrode 212 of the resonating structure 201. Typically, atomic layer deposition (ALD) may be used to deposit the insulating layer 214, which may provide superior thickness control and conformal coverage compared to other techniques. By using ALD, thinner layers can be used, which may improve the performance of the resonating structure 201 by not loading it excessively. In cases where excessive loading is not a concern, the insulating layer 214 may be deposited using conventional plasma assisted chemical vapor deposition (PCVD) or physical vapor deposition (PVD).

The insulating layer 214 may electrically insulate the rest of the resonating structure 201 from fluids in the microfluidic channel 14 (FIG. 1). For example, the insulating layer 214 may be disposed between the channel 14 and the second electrode 212.

The insulating layer 214 may also be described as an oxygen containing layer, a coupling layer, a functionalized layer, or any combination of these. In particular, the insulating layer 214 may have a functionalized material disposed on the surface 216. The insulating layer 214 may be functionalized to bind with one or more analytes that may be present in a fluid sample.

Figure 4:
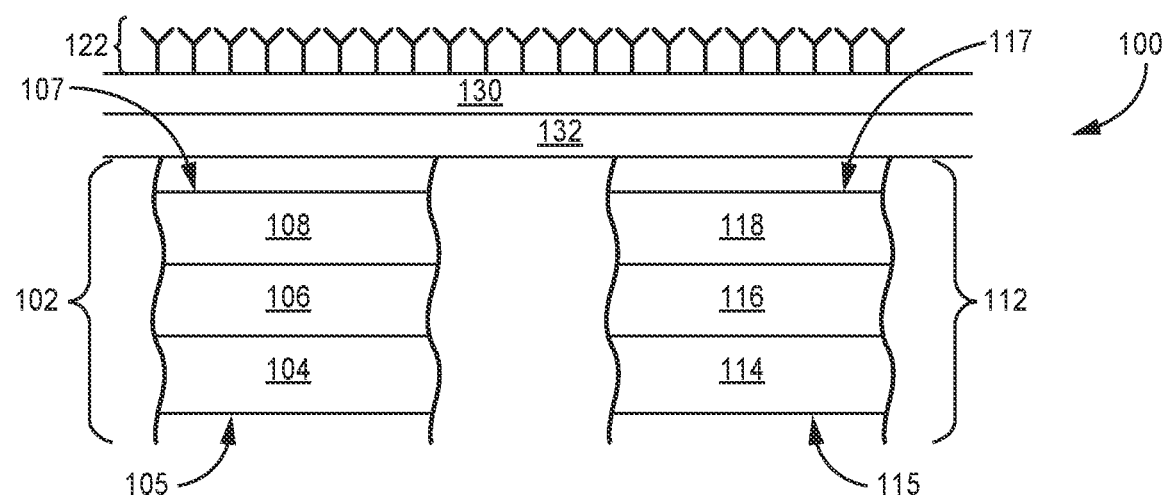
FIG. 4 is a cross-sectional view of a sensor according to another embodiment of the present disclosure.

FIG. 4 shows one example of another sensor 100. As illustrated, the sensor 100 includes a first resonator structure 102 and a second resonator structure 112. In some embodiments, the first resonator structure 102 and the second resonator structure 112 can be substantially the same and, in some embodiments, they can be different in one or more aspects. Each of the first resonator structure 102 and the second resonator structure 112 has a first surface 105 and 115 respectively and an opposing second surface 107 and 117 respectively. The first resonator structure 102 and the second resonator structure 112 may be located a distance apart. This distance is depicted as d in FIG. 5. In some embodiments, the first resonator structure 102 and the second resonator structure 112 may be spaced at least 1 micrometer (μm) apart (d), and in some embodiments, they may be spaced at least 45 μm apart (d). In some embodiments, the first resonator structure 102 and the second resonator structure 112 may be spaced not more than 100 μm (d), and in some embodiments, they may be spaced not more than 75 μm apart (d). In some embodiments, the spacing between two resonator structures need not be constant; the spacing between two resonator structures need not be the same as the spacing between two other resonator structures, or any combination thereof.

Each of the resonator structures for example, at least the first resonator structure 102 and the second resonator structure 112, can include a bottom electrode 104 and 114, a piezoelectric layer 106 and 116, and a top electrode 108 and 118. The piezoelectric layer 106 and 116 is positioned between the bottom electrode 104 and 114 and the top electrode 108 and 118. Additional layers not depicted in FIG. 4 can also be interspersed between, above, below, or some combination thereof the noted layers.

It should be noted that the bottom electrodes 104 and 114 of the resonator structures 102 and 112 can be part of a single layer. The same can be said for the piezoelectric layers 106 and 116 and the top electrodes 108 and 118. This implies that the bottom electrodes (or one or two of the bottom electrodes, the top electrodes, and the piezoelectric layers) of the at least two resonator structures can have a bottom electrode (or other combination) that is shared or the bottom electrodes (or other combination) can be distinct but formed from a single material layer. In embodiments where the first resonator structure 102 and the second resonator structure 112 include at least two particular structures (bottom electrode, piezoelectric layer, or top electrode) that are formed from a single material layer, the material layers forming the distinct particular structures need not exist across the entire larger device housing the sensor (if such a larger construct exists). For example, a sensor could include bottom electrodes 104 and 114 that are formed from a single layer of material; and piezoelectric layers 106 and 116 that are formed from a single layer of material. The layers that form the bottom electrodes and the piezoelectric layers respectively need not be entirely congruous. For example, portions of the piezoelectric material could be removed at various locations across the sensor. It should also be noted that disclosed resonator structures such as the first and second resonator structure structures 102 and 112 are formed only at locations where bottom electrode material and top electrode material overlap with piezoelectric material therebetween. In some embodiments, the bottom electrode 104 and 114, the piezoelectric layer 106 and 116 and the top electrode 108 and 118 can all be formed from a single deposited layer of bottom electrode material, piezoelectric material, and top electrode material respectively. It should also be noted that in some embodiments, a plurality of bottom electrodes, top electrodes, piezoelectric layers, or any combination thereof for a plurality of resonator structures can be entirely freestanding forming freestanding resonator structures but could have been formed from a single layer of material. It should also be noted that each of or any of the bottom electrode, the piezoelectric layer, and the top electrode could have shapes that are different than any of the others.

The first and second resonator structures 102 and 112 may be made of various materials. In some embodiments, the bottom electrode 104 and 114 can be made of the same material. Illustrative materials for the bottom electrode 104 and 114 can include for example, aluminum (Al), gold (Au), tungsten (W), copper (Cu), molybdenum (Mo), and tantalum (Ta). In some embodiments, the bottom electrode 104 and 114 can both include aluminum. In some embodiments, the top electrode 108 in 118 can be made of the same material. Illustrative materials for the top electrode 108 and 118 can include for example, Au, Al, W, Cu, Mo, and Ta. In some embodiments, the top electrode 108 and 118 can both include gold. In some embodiments, the piezoelectric layer 106 and 116 can be made of the same material. Illustrative materials for the piezoelectric layer 106 and 116 can include for example aluminum nitride (AlN), zinc oxide (Zn), and lead zirconate titanate (PZT). In some embodiments, the piezoelectric layer 106 and 116 can both include aluminum nitride.

Figure 5:
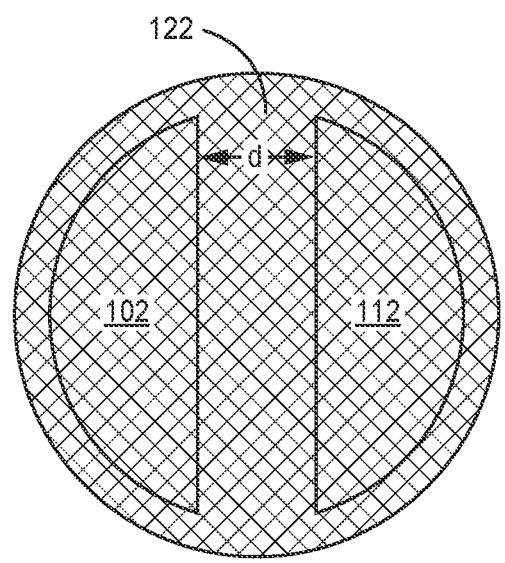
FIG. 5 is a top-down view of the sensor of FIG. 5.

In some embodiments, the at least first and second resonator structures 102 and 112 can be described as having substantially the same shape. In some embodiments, the first and second resonator structures can each be described as having a semicircular shape. FIG. 5 depicts a top down view of an illustrative sensor including a first resonator structure 102 and a second resonator structure 112 both having a substantially semicircular shape. The sensor 100 can be described as having a substantially circular resonator configuration, with the two semicircular shaped resonator structures 102 and 112 configured to form the substantially circular resonator configuration. The sensor 100 can also be described as having a substantially circular sensor shape because the molecular recognition component layer 122 (discussed below), or functionalized material layer, has a substantially circular shape.

In some illustrative embodiments, a substantially semicircular shape of each of the first and second resonator structures 102 and 112 can be formed by top electrode layers 108 and 118 that share a substantially circular shaped material layer and bottom electrode layers 108 and 118 that are both independently substantially semicircular and distinct (e.g., a circle of bottom electrode material with a gap spanning the diameter of the circle, the gap having a width d). Layers of top electrode, piezoelectric, bottom electrode, or any combination thereof materials can be patterned to provide any desired shapes, including for example semicircular shapes, circular shapes, square shapes, rectangular shapes, or otherwise using known methods including lithography methods for example.

In some embodiments, at least the first resonator structure 102 and the second resonator structure 112 (and additional resonator structures if present) can be electrically connected to each other in series. It is noted that the electrical connections of the two or more resonator structures are not depicted in the attached figures. One of skill in the art having read the specification will understand and know how to connect at least the first resonator 102 and the second resonator 112 in series. The serial connection of the at least first resonator 102 and the second resonator 112 generally makes a signal received therefrom as if it was received from a single resonator.

In some embodiments, the sensor can also include an oxygen containing layer. The sensor 100 depicted in FIG. 4 includes oxygen containing layer 132 positioned on the second surface 107 and 117 of the first and second resonator structures 102 and 112. In some embodiments, the oxygen containing layer 132 can exist across substantially the entire sensor.

An oxygen containing layer can include oxygen atoms, compounds including oxygen atoms, or both. In some embodiments, an oxygen containing layer can be an oxide layer, or more specifically a metal oxide layer and can include any metal oxide or metalloid oxide. In some embodiments, the oxide layer can include $TiO_2$, $SiO_2$, $Al_2O_3$, or ZnO. In some embodiments, the oxide layer can include $TiO_2$. An oxide layer can be described as including oxygen atoms. The oxygen atoms can function to chemically bond or bind material of a layer deposited thereon.

An oxygen containing layer can be deposited using various methods. In some embodiments, an oxygen containing layer can be deposited using atomic layer deposition (ALD). ALD can provide oxide layers that are relatively thin, relatively uniform, relatively dense, or some combination thereof. ALD can be described as a self-limiting process that builds films of material in layers and can therefore repeatably produce uniform and very thin films.

A sensor can also include a coupling layer. The sensor 100 disclosed in FIG. 4 includes a coupling layer 130. The coupling layer 130 can generally be described as positioned over the oxygen containing layer 132. In some embodiments, the coupling layer can exist across substantially the entire sensor 100. In some embodiments, the coupling layer can be described as a monolayer of the compound making up the coupling layer. In some embodiments, the coupling layer 130 can have a thickness that is at least 10 Å, or at least 20 Å. In some embodiments, the coupling layer 130 can have a thickness that is not greater than 100 Å, or not greater than 50 Å.

In some embodiments, the coupling layer 130 can be more specifically described as a silane layer or including a silane containing component. The silane layer can more specifically be described as made up of silane coupling agents. Silane coupling agents are silicon-based chemicals that contain both inorganic reactivity and organic reactivity in the same molecule. A general structure can be described as $(RO)_3SiCH_2CH_2CH_2$—X, where RO represents the inorganic reactivity group or a hydrolyzable group (for example, methoxy, ethoxy, acetoxy, thiol, or aldehyde) and X represents a group containing an organic reactivity group (for example, amino, methacryloxy, or epoxy) and X can also include additional carbons $(—(CH_2)_n)$ and may or may not include functional groups. In the sensor 100, a silane coupling layer 130 can function to couple the oxide layer 132 to the molecular recognition component layer 122.

Illustrative materials that can be utilized to form a silane coupling layer 130 can include for example (3-Aminopropyl)triethoxysilane, (3-Aminopropyl)trimethoxysilane, (3-Glycidyloxypropyl)trimethoxysilane, (3-Glycidyloxypropyl)triethoxysilane, (3-Mercaptopropyl)trimethoxysilane, (3-Mercaptopropyl)triethoxysilane, Trimethoxy[2-(7-oxabicyclo[4.1.0]hept-3-yl)ethyl]silane, Triethoxy[2-(7-oxabicyclo[4.1.0]hept-3-yl)ethyl]silane, Trimethoxysilyl Alkyl Aldehyde, and Triethoxysilyl Alkyl Aldehyde. In some embodiments, a silane layer 130 can be formed with (3-Glycidyloxypropyl)triethoxysilane, for example.

A sensor may include a molecular recognition component layer. The sensor 100 of FIG. 4 includes a molecular recognition component layer 122. The molecular recognition component layer 122 can generally be described as positioned adjacent to at least the first and second resonator structure and can more specifically be described as positioned over the coupling layer 130. In some embodiments, the molecular recognition component layer 122 can exist across substantially the entire sensor 100. In some embodiments, the molecular recognition component layer 122 can have a thickness that is at least 5 Å, or at least 50 Å. In some embodiments, the molecular recognition component layer 122 can have a thickness that is not greater than 2000 Å, or not greater than 250 Å.

The molecular recognition component layer 122 can include any material capable of interacting with an analyte of interest in such a way that would allow the analyte of interest to be analyzed. The molecular recognition component could include any component that selectively binds to the analyte of interest. By way of example, the molecular recognition component may be selected from the group consisting of nucleic acids, nucleotide, nucleoside, nucleic acids analogues such as PNA and LNA molecules, proteins, peptides, antibodies including IgA, IgG, IgM, IgE, lectins, enzymes, enzymes cofactors, enzyme substrates, enzymes inhibitors, receptors, ligands, kinases, Protein A, Poly U, Poly A, Poly lysine, triazine dye, boronic acid, thiol, heparin, polysaccharides, coomassie blue, azure A, metal-binding peptides, sugar, carbohydrate, chelating agents, prokaryotic cells and eukaryotic cells. In some embodiments, antibodies can be utilized as the molecular recognition component, and in such embodiments, the thickness of the molecular recognition component layer 122 can be described as not less than 100 Å, or in some embodiments, not less than 150 Å.

The molecular recognition component layer 122 can be formed on (or more specifically bound to) the coupling layer 130 using known techniques. One or more than one individual elements or chemical groups (containing two or more elements) components in the molecular recognition component layer can each be chemically bonded to, for example, a silane or more than one silane in the coupling layer 130. Conditions and process steps for affecting this binding would be known to one of skill the art reading the specification. It should also be noted that molecular recognition components could be bound to the coupling layer through additional coupling agents or compounds other than just the coupling layer itself. In some embodiments, an antibody can be utilized as a molecular recognition component and it can be bound to an epoxy silane containing coupling layer.

In some embodiments, a molecular recognition component layer 122 can have a substantially circular shape. The molecular recognition component layer 122 can generally be described as covering both the at least first and second resonator structures 102 and 112. The shape of the molecular recognition component layer 122 can in part define the shape of the sensor 100 (in combination with or in light of the resonator configuration as discussed above). In some embodiments, a molecular recognition layer can be of a shape that is designed to at least cover the entire surface overlying the regions of the at first and second resonator structures. In some embodiments, a molecular recognition component layer can be of a shape that covers more than the entire surface overlying regions of the at least first and second resonator structures. In some embodiments, the substantially circular shape of a molecular recognition component layer can be due at least in part to the process that forms the layer. Details of such process are described below.

As mentioned above, first and second resonator structures 102 and 112 may optionally include layers not depicted in FIG. 4. For example, layers designed to promote adhesion between two layers, layers designed to protect structures, layers, or materials, layers designed to provide other functions, or any combination thereof may optionally be included in first and second resonator structures.

A specific example of an optional additional layer can include an adhesion layer for example. For example, an adhesion layer can be formed on the surface of the piezoelectric layers 106 and 116. In some embodiments, an adhesion layer if included may function to improve adhesion between the top electrode material and the piezoelectric layers. In some embodiments, an adhesion layer if included may include materials that are compatible with the material of the top electrode layer, the material of the piezoelectric layer, or both. Illustrative specific materials that can be used for the adhesion layer can include for example titanium (Ti), or chromium (Cr). In some embodiments, where the top electrode is gold, an optional adhesion layer may include Ti or Cr, for example. In some embodiments, an adhesion layer if included may have a thickness of at least 100 Å, at least 200 Å, or at least 250 Å. In some embodiments, an adhesion layer if included may have a thickness of not greater than 500 Å, not greater than 400 Å, or not greater than 350 Å. In some embodiments, an adhesion layer if included may have a thickness of about 300 Å.

Illustrative sensors may also include optional components not discussed above. For example, in some embodiments, a sensor may include a Bragg reflector stack (e.g., acoustic mirror layer 204 of FIGS. 3A-3B). In some embodiments, a Bragg reflector stack if included may be disposed beneath the bottom electrodes 104 and 114 of at least both the first and second resonator structures. First and second resonator structures having an adjacent configuration such as that utilized in disclosed sensors may become coupled through the substrate on which they are formed. Such coupling may be considered undesirable. Utilization of an optical Bragg reflector stack may function to alleviate such coupling. Although reduction of such coupling by the Bragg reflector stack may be beneficial, the Bragg reflector stacks may create parasitic resonances. Connecting the first and second resonator structures in series may diminish or prevent the possible parasitic resonances. The electrical and mass loading effect of the first and second resonator structures connected in series can be as good as (in some embodiments, better than) a single resonator minus the Bragg reflector stack induced parasitic resonances.

Figure 6:
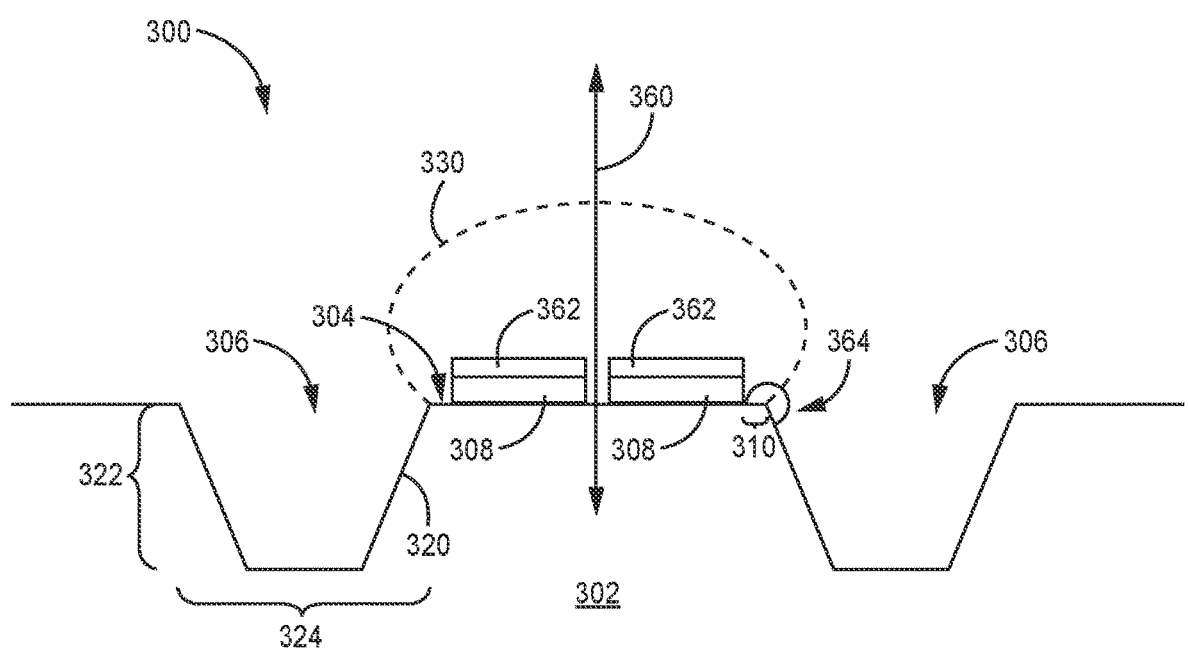
FIG. 6 is a cross-sectional view of a sensor having a retaining structure according to another embodiment of the present disclosure.
Figure 7:
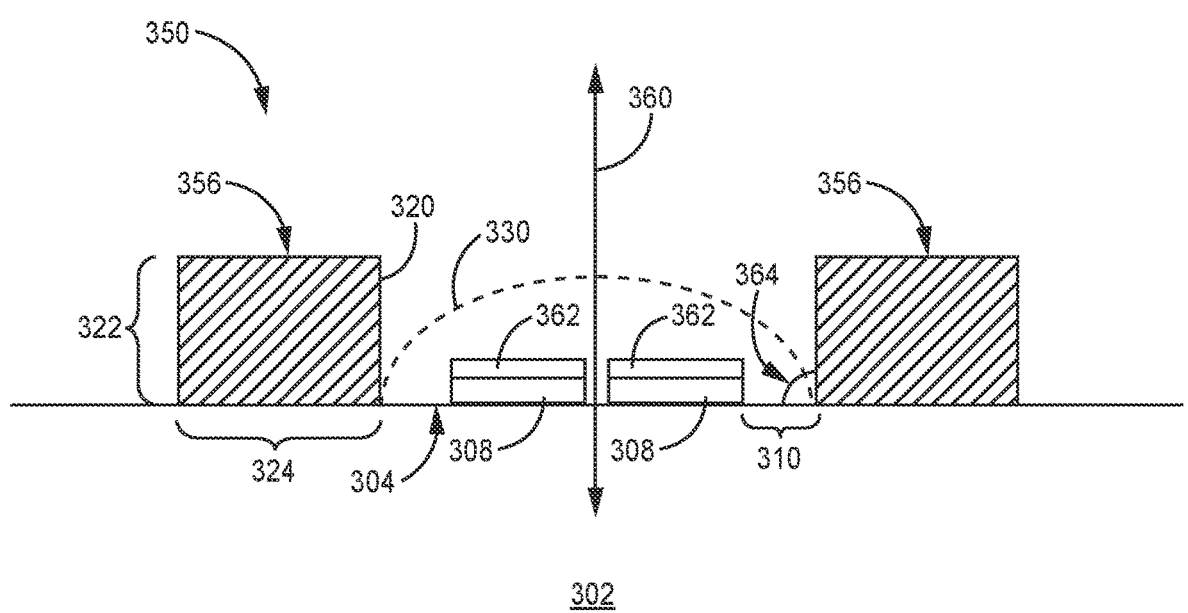
FIG. 7 is a cross-sectional view of a sensor having a retaining structure according to yet another embodiment of the present disclosure.

FIGS. 6 and 7 show two variations of sensors 300, 350 having retaining structures 306, 356. The sensors 300, 350 may be used, for example, in die 12 of FIG. 2. In the illustrated embodiments, each sensor 300, 350 includes a substrate 302 defining a target surface 304 and a retaining structure 306, 356 extending at least partially around the target surface 304. In some embodiments, the retaining structures 306, 356 extend entirely around their respective target surface 304.

A droplet 330 of functionalized material (e.g., an antibody solution droplet) may be printed onto the target surface 304. The functionalized material, or antibodies, may react and bind to the silane to further enhance binding with analyte, or antigens, of interest in a sample. In some embodiments, the droplet 330 may be printed to ensure full coverage (e.g., 100%) of a resonator structure 308 disposed on the target surface 304. When the droplet 330 of functionalized material is disposed on the target surface 304 at least partially surrounded by the retaining structure 306, 356 (e.g., in a target area interior to the retaining structure 306, 356), the droplet 330 may be retained on the targets surface 304. In other words, the droplet 330 may be prevented from easily moving off the target surface 304 or away from one or more resonator structures 308 disposed on the target surface 304 due to the retaining structures 306, 356. The droplet 330 may also be "auto-aligned" even when disposed off-center to the target surface 304.

The target surface 304 may define an axis 360 orthogonal to the target surface 304. The retaining structures 306, 356 may each have a height 322 extending in a direction of the axis 360 (e.g., as illustrated, vertically upward or downward). The retaining structures 306, 356 may each have a width 324 extending in a direction orthogonal to the axis 360 (e.g., as illustrated, horizontally left or right).

One or more resonator structures 308 may be disposed on the target surface 304. As shown, two resonator structures 308 are disposed on the target surface 304. The resonator structures 308 may be the same as or similar to, for example, the resonator structures 201 of FIGS. 3A-3B or resonator structures 102, 112 of FIGS. 4-5 in one or more aspects. Each resonating structure 308 may include a piezoelectric layer.

An insulating layer 362 may be disposed on each resonating structure 308. Each insulating layer 362 may be configured to couple to a functionalized material, such as material recognition layer 122 of FIGS. 4-5. The insulating layers 362 may be the same as or similar to, for example, the insulating layer 214 of FIGS. 3A-3B or the coupling layer 130 of FIG. 4 in one or more aspects.

One or more of the retaining structures 306, 356 may extend into the substrate 302 or out of the substrate 302. As shown in FIG. 6, retaining structure 306 includes a channel with height 322 extending into the substrate 302. The channel may be formed by any suitable methods available to one of ordinary skill in the art, such as etching. As shown in FIG. 7, retaining structure 356 includes a protrusion, or wall, with height 322 extending out of the substrate 302. In other words, the retaining structure 356 protrudes from the target surface 304 of the substrate 302. The protrusion may be formed by any suitable methods available to one of ordinary skill in the art, such as vapor deposition or photoresist etching.

The height 322, width 324, or both the height and width, of the retaining structures 306, 356 may be sized based on a predetermined size of the droplet 330 of functionalized material to be placed on the target surface 304 and/or based on the size of the target surface 304 itself. In some embodiments, the height 322 of the retaining structure 306, 356 may be at least about 0.01, 0.05, 0.1, 0.25, 0.5, 0.75, 1, 2, 5, 10, 20, or 30 µm. In some embodiments, the height 322 of the retaining structure 306, 356 may be at most 0.01, 0.05, 0.1, 0.25, 0.5, 0.75, 1, 2, 5, 10, 20, or 30 µm.

The height 322 of the retaining structure 306, 356 be based on the manner it is formed. In some embodiments, the retaining structure 306, which may be formed by etching, may be at least or at most about 0.05, 0.1, 0.25, 0.5, 0.75, 1, or 2 µm. In some embodiments, the retaining structure 356, which may be formed with photoresist into a wall, may be at least or at most about 0.05, 0.1, 0.25, 0.5, 0.75, 1, 2, 5, 10, 20, or 30 µm. In one example, TMMF™ may be formed with a height 322 of about 20 µm. In another example, polyimide may be formed with a height 322 of about 0.5 to 10 µm. In some embodiments, the retaining structure 356, which may be formed with a hydrophobic material into a wall, may be at least or at most about 0.01, 0.05, 0.1, 0.25, 0.5, 0.75, 1, 2, or 5 µm.

Using a hydrophobic material to form the wall may allow the retaining structure 356 to have a smaller height than other types of materials, which may reduce diffusion effects from impeding fluid flow near the wall. Hydrophobic materials may be more challenging to process and handle, however, than other types of materials (e.g., some photoresists, such as TMMF™) using some existing fabrication techniques.

In some embodiments, the width 324 of the retaining structure 306, 356 may be at least about 0.5, 1, 2, 3, 4, 5, 10, 15, 20, or 30 µm. In some embodiments, the width 324 of the retaining structure 306, 356 may be at most about 0.5, 1, 2, 3, 4, 5, 10, 15, 20, or 30 µm. The aspect ratio between the height 322 and width 324 may be about one-to-one (e.g., about equal height and width). In some embodiments, the width 324 may be greater than the height 322, or vice versa.

The droplet 330 of functionalized material is illustrated as a spot, or bead up, of liquid material. The retaining structures 306, 356 may utilize various techniques to retain the droplet substantially on the target surface 304.

In one example, the droplet of functionalized material 330 has a surface tension that creates a contact angle with the target surface 304 of the substrate 302. The contact angle is defined with reference to the target surface 304. The retaining structure 306 including a channel may allow the contact angle of the droplet to almost invert (for example, reach up to about 180 degrees) without spilling, or flowing, outside of the target surface 304. Non-limiting examples of the contact angle of the droplet 330 allowed by retaining structure 306 include at least about 60, 90, 120, 150, or 180 degrees, as well as any suitable range between any of these.

In another example, the retaining structure 356 including a protrusion (e.g., in a vertically upward direction) may act like a container to retain the droplet 330 of functionalized material. The target surface 304 may at least partially form the bottom of such a container and the retaining structure 356 may at least partially form the sidewalls of such container. The retaining structure 356 may be formed of any suitable material. Non-limiting examples of material for the retaining structure 356 include a dry film, such as a dry film of SU-8 (e.g., TMMF™ S2000 commercially available from Tokyo Ohka Kogyo America, Hillsboro, Oregon), polyimide, and other photoresists.

Additionally, or alternatively, the retaining structure 356 may include, or be formed of, a hydrophobic material. The droplet 330 of functionalized material may include polarized molecules, such as water molecules. A repelling force may act upon the droplet 330 as it approaches the retaining structure 356 made of a hydrophobic material. Non-limiting examples of hydrophobic material include paraffin wax, chemical vapor deposition (CVD) TEFLON™, spin-on TEFLON™ (e.g., TELFON™ AF available from Chemours, Wilmington, Delaware), and fluorinated polyimide or photoresists. Using a hydrophobic material may be used to correct for diffusion effects that may be associated with retaining structure 356.

The retaining structures 306, 356 may be any suitable shape that retains the droplet 330 on the target surface 304. For example, as illustrated, the retaining structure 306 is a ring shape with a trapezoidal cross-section, and the retaining structure 356 is a ring shape with a rectangular cross-section. In some embodiments, the droplet 330 may be retained at the inner diameter or outer diameter of the ring shape of the retaining structure 306, 356, depending on the size of the droplet 330.

In some embodiments, the retaining structure 306, 356 includes, or defines, a sidewall surface 320 extending from the target surface 304. The sidewall surface 320 may form, or define, an angle 364 relative to the target surface 304. The angel 364 may be measured based on an average slope of the sidewall surface 320 along its entire length (e.g., top to bottom). Non-limiting examples of the angle 364 include, in a positive or negative (+/−) direction, about 45, 60, 75, and 90 degrees, as well as any suitable ranges between any of these. In other words, for example, the angle 364 may have an absolute value that is about 45, 60, 75, or 90 degrees. For example, in one or more embodiments, the angle 364 has an absolute value of at least about 60 degrees. In one or more embodiments, the angle 364 has an absolute value of about 90 degrees. The angle may change, for example, due to the manufacturing process used to form the retaining structure 308.

A portion 310 of the target surface 304 may be defined between the resonating structure 308 and the retaining structure 306, 356. In some embodiments, the portion 310 has a width that is sufficient to allow for full coverage of the resonator structure 308 by the droplet 330 such that the droplet does not spill or flow outside of the target surface 304. Non-limiting examples of a width of the portion 310 include about 5, 10 15, 20, and 25 μm, as well as any suitable ranges between any of these. For example, in some embodiments, the portion has a width equal to at least about 5 μm. In some embodiments, the portion has a width equal to at most about 25 μm.

Figure 8:
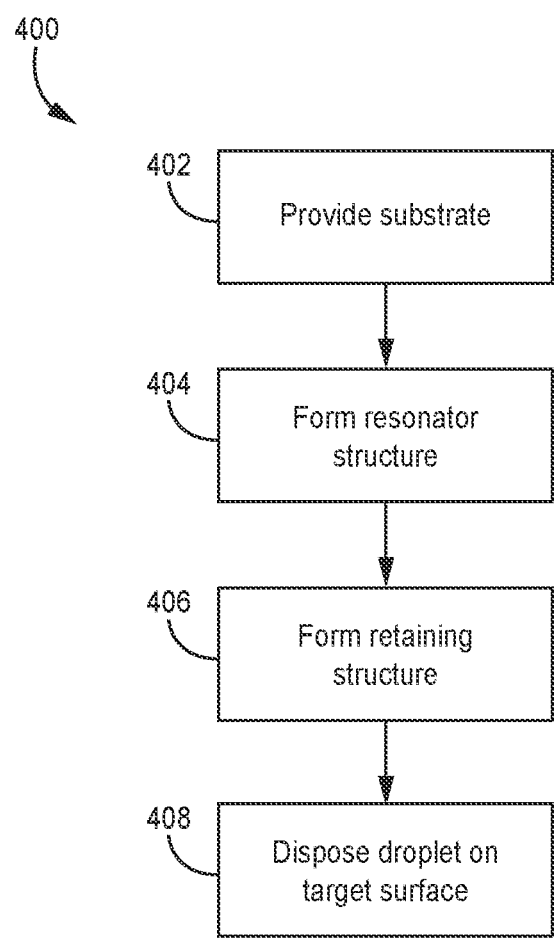
FIG. 8 is a schematic diagram of a method of forming a sensor according to one embodiment of the present disclosure.

FIG. 8 shows one example of a method 400 for at least partially forming a sensor with a retaining structure. A substrate may be provided 402. The substrate may include any suitable material, such as silicon nitride ($Si_3N_4$) or (AlN). A resonator structure may be formed on the substrate 404. In particular, the resonator structure may be formed on a target surface (e.g., within a target area) of the substrate. The resonator structure may include an insulating layer, which may include a coupling layer.

A retaining structure may be formed on the substrate 406. Any suitable technique may be used, such as etching plasma enhanced chemical vapor deposited (PECVD) $Si_3N_4$ or BCL3 etching of AlN. The retaining structure may be, for example, a "moat-type" structure, or ring, around the resonator structure that is lower than an upper surface of the resonator structure. The sidewalls of the retaining structure may be 90 degrees (e.g., vertical) to a target surface. In some embodiments, the sidewalls of the retaining structure are non-vertical, such as 60-degree sidewalls etched into AlN.

Although the illustrated embodiment shows forming the resonator structure 404 before forming the retaining structure 406, these processes may be carried out concurrently or sequentially in any order. For example, the retaining structure may be formed during formation of the resonator structure, in particular, before the top electrode of the resonator structure is formed.

A droplet may be disposed on the target surface 408. In particular, a droplet of functionalized material may be disposed on the target surface to cover the resonator structure after the resonator structure is formed 404 and after the retaining structure is formed 406.

The droplet may be particularly sized to the size of the resonator structures. For example, for a 350 μm circular BAW resonator used as a biosensor, approximately 12 nanoliters (nl) of antibody solution may be printed on the BAW surface to make the sensor specific to an antigen of interest. The surface of the sensor may have a contact angle of approximately 60 degrees due to the silanization of an oxide surface atop the resonator.

The retaining structure may provide a force that maintains the drop on the resonator structure and, provided adequate volume is dispensed, the droplet will auto-align to the resonator surface. Using the retaining structure may provide alignment tolerance when disposing, or printing, the droplets. In addition, using the retaining structure may provide substantial volume tolerance due to the contact angle inversion required to spill over.

Table 1 shows auto-alignment yield of a droplet of 12 nl and 21 nl sizes (first column) of three different depths of an etch into $Si_3N_4$ (first row). In general, a higher yield is better.

TABLE 1

|  | 100 nm | 250 nm | 500 nm |
| --- | --- | --- | --- |
| 12 nl | 49% | 90% | 98% |
| 21 nl |  | 43% | 100% |

For purposes of the results shown in Table 1, the instrument, cartridge, and device may be as described in U.S.

Patent Application Publication No. 2016/0091506 A1, published on Mar. 31, 2016, and entitled "Two Part Assembly," which is incorporated herein in its entirety by reference. The teachings presented herein may be applied with any other suitable microfluidic device for which a sample is introduced.

The retaining structures may be particularly sized depending on the size of the intended droplet. In one embodiment, the retaining structure is made of TMMF™ and has a 20 μm diameter. In another embodiment, the retaining structure may be made of polyimide and have a 1 μm diameter. In some embodiments, the retaining structure may be made of polyimide and have a 2 μm diameter.

A system or controller may be used to carry out various manufacturing aspects to form the sensor, such as method 400 shown in FIG. 8. Such a system or controller may include, or be operatively coupled to, actuators or other mechanical components capable of physically carrying out those various manufacturing aspects. Such a system or controller may also include a processor, such as a central processing unit (CPU), computer, logic array, or other device capable of directing data coming into or out of the system or controller. The controller may include one or more computing devices having memory, processing, and communication hardware. The controller may include circuitry used to couple various components of the controller together or with other components operably coupled to the controller. The functions of the controller may be performed by hardware and/or as computer instructions on a non-transient computer readable storage medium.

The processor of the controller may include any one or more of a microprocessor, a microcontroller, a digital signal processor (DSP), an application specific integrated circuit (ASIC), a field-programmable gate array (FPGA), and/or equivalent discrete or integrated logic circuitry. In some examples, the processor may include multiple components, such as any combination of one or more microprocessors, one or more controllers, one or more DSPs, one or more ASICs, and/or one or more FPGAs, as well as other discrete or integrated logic circuitry. The functions attributed to the controller or processor herein may be embodied as software, firmware, hardware, or any combination thereof. While described herein as a processor-based system, an alternative controller could utilize other components such as relays and timers to achieve the desired results, either alone or in combination with a microprocessor-based system.

In one or more embodiments, the exemplary systems, methods, and interfaces may be implemented using one or more computer programs using a computing apparatus, which may include one or more processors and/or memory. Program code and/or logic described herein may be applied to input data/information to perform functionality described herein and generate desired output data/information. The output data/information may be applied as an input to one or more other devices and/or methods as described herein or as would be applied in a known fashion. In view of the above, it will be clear that the controller functionality as described herein may be implemented in any manner known to one skilled in the art.

Thus, various embodiments of the SENSOR WITH DROPLET RETAINING STRUCTURE are disclosed. Although reference is made herein to the accompanying set of drawings that form part of this disclosure, one of at least ordinary skill in the art will appreciate that various adaptations and modifications of the embodiments described herein are within, or do not depart from, the scope of this disclosure. For example, aspects of the embodiments described herein may be combined in a variety of ways with each other. Therefore, it is to be understood that, within the scope of the appended claims, the claimed invention may be practiced other than as explicitly described herein.

It will be understood that each block of the block diagrams and combinations of those blocks can be implemented by means for performing the illustrated function.

All references and publications cited herein are expressly incorporated herein by reference in their entirety for all purposes, except to the extent any aspect directly contradicts this disclosure.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims may be understood as being modified either by the term "exactly" or "about." Accordingly, unless indicated to the contrary, the numerical parameters set forth in the foregoing specification and attached claims are approximations that can vary depending upon the desired properties sought to be obtained by those skilled in the art utilizing the teachings disclosed herein or, for example, within typical ranges of experimental error.

The recitation of numerical ranges by endpoints includes all numbers subsumed within that range (e.g. 1 to 5 includes 1, 1.5, 2, 2.75, 3, 3.80, 4, and 5) and any range within that range. Herein, the terms "up to" or "no greater than" a number (e.g., up to 50) includes the number (e.g., 50), and the term "no less than" a number (e.g., no less than 5) includes the number (e.g., 5).

The terms "coupled" or "connected" refer to elements being attached to each other either directly (in direct contact with each other) or indirectly (having one or more elements between and attaching the two elements). Either term may be modified by "operatively" and "operably," which may be used interchangeably, to describe that the coupling or connection is configured to allow the components to interact to carry out at least some functionality.

Terms related to orientation, such as "top," "upward," "bottom," "downward," "vertical," "horizontal," "side," and "end," among others, are used to describe relative positions of components and are not meant to limit the orientation of the embodiments contemplated. For example, an embodiment described as having a "top" and "bottom" also encompasses embodiments thereof rotated in various directions unless the content clearly dictates otherwise.

Reference to "one embodiment," "an embodiment," "certain embodiments," or "some embodiments," etc., means that a feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in one or more embodiments.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

As used herein, "have," "having," "include," "including," "comprise," "comprising" or the like are used in their open-ended sense, and generally mean "including, but not limited to." It will be understood that "consisting essentially of," "consisting of," and the like are subsumed in "comprising," and the like.

The term "and/or" means one or all the listed elements or a combination of at least two of the listed elements.

The phrases "at least one of," "comprises at least one of," and "one or more of" followed by a list refers to any one of the items in the list and any combination of two or more items in the list.

What is claimed is:

1. A sensor with a droplet retaining structure comprising:
   a substrate defining a target surface and a retaining structure extending at least partially around the target surface,
   wherein the retaining structure comprises a channel having a height extending in a direction orthogonal to the target surface and into the substrate, and a width extending in a direction parallel to the target surface; and
   a resonating structure disposed on the target surface of the substrate,
   wherein a portion of the target surface between the resonating structure and the retaining structure has a width that allows for full coverage of the resonating structure with a droplet of functionalized material such that the droplet of functionalized material auto-aligns with the resonating structure and is prevented from moving.

2. The sensor of claim 1, wherein the height of the retaining structure is at least 0.01 micrometers.

3. The sensor of claim 1, wherein the portion of the target surface between the resonating structure and the retaining structure has a width equal to at least 5 micrometers.

4. The sensor of claim 1, wherein the portion of the target surface between the resonating structure and the retaining structure has a width equal to at most 25 micrometers.

5. The sensor of claim 1, further comprising an insulating layer disposed on the resonating structure and configured to couple to the functionalized material in the droplet.

6. The sensor of claim 5, wherein the insulating layer comprises silane.

7. The sensor of claim 5, further comprising an oxide layer disposed between the resonating structure and the insulating layer.

8. The sensor of claim 1, wherein the retaining structure extends entirely around the target surface.

9. The sensor of claim 1, wherein the channel of the retaining structure comprises sidewalls, wherein the sidewalls are 60-degree sidewalls.

10. The sensor of claim 1, wherein the resonating structure comprises a piezoelectric layer.

11. A sensor with a droplet retaining structure comprising:
    a substrate defining a target surface and a retaining structure extending at least partially around the target surface, the retaining structure having a height extending in a direction orthogonal to the target surface and a width extending in a direction parallel to the target surface; and
    a resonating structure disposed on the target surface of the substrate,
    wherein a portion of the target surface between the resonating structure and the retaining structure has a width that allows for full coverage of the resonating structure with a droplet of functionalized material such that a volume of the droplet of functionalized material required to cover the resonating structure is minimized, the droplet auto-aligns with the resonating structure and the droplet is prevented from moving outside of the target surface.

12. The sensor of claim 11, wherein the retaining structure extends entirely around the target surface.

13. The sensor of claim 11, wherein the height of the retaining structure is at least 0.01 micrometers.

14. The sensor of claim 11, wherein the portion of the target surface between the resonating structure and the retaining structure has a width equal to at least 5 micrometers.

15. The sensor of claim 11, wherein the portion of the target surface between the resonating structure and the retaining structure has a width equal to at most 25 micrometers.

16. The sensor of claim 11, wherein the retaining structure comprises a wall having a height extending out of the substrate.

17. The sensor of claim 16, wherein the wall comprises a hydrophobic material.

18. The sensor of claim 11, wherein the retaining structure comprises a sidewall surface extending from the target surface, wherein the sidewall surface forms an angle with the target surface with an absolute value of at least 60 degrees.

19. The sensor of claim 18, wherein the sidewall surface forms an angle with the target surface with an absolute value equal to 90 degrees.

20. The sensor of claim 11, wherein the resonating structure comprises a piezoelectric layer.

* * * * *